United States Patent
Pyo

(10) Patent No.: US 12,207,424 B2
(45) Date of Patent: Jan. 21, 2025

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 175 days.

(21) Appl. No.: 17/927,503

(22) PCT Filed: May 26, 2020

(86) PCT No.: PCT/KR2020/006785
§ 371 (c)(1),
(2) Date: Nov. 23, 2022

(87) PCT Pub. No.: WO2021/241770
PCT Pub. Date: Dec. 2, 2021

(65) Prior Publication Data
US 2023/0199981 A1 Jun. 22, 2023

(51) Int. Cl.
*H05K 5/02* (2006.01)
*H02K 7/00* (2006.01)
*H02K 7/116* (2006.01)
*H02K 7/14* (2006.01)
*H02K 11/20* (2016.01)

(52) U.S. Cl.
CPC ........... *H05K 5/0217* (2013.01); *H02K 7/003* (2013.01); *H02K 7/116* (2013.01); *H02K 7/14* (2013.01); *H02K 11/20* (2016.01)

(58) Field of Classification Search
CPC ...... H05K 5/0217; H02K 7/003; H02K 7/116; H02K 7/14
See application file for complete search history.

(56) References Cited

U.S. PATENT DOCUMENTS

| | | | |
|---|---|---|---|
| 9,064,431 B2 * | 6/2015 | Ahn | G06F 1/1616 |
| 2017/0325343 A1 * | 11/2017 | Seo | H05K 5/03 |
| 2018/0114471 A1 * | 4/2018 | Park | G06F 1/1652 |
| 2018/0125228 A1 * | 5/2018 | Porter | H05K 5/0017 |
| 2018/0160554 A1 * | 6/2018 | Kang | H05K 5/0017 |

* cited by examiner

*Primary Examiner* — Jacob R Crum
(74) *Attorney, Agent, or Firm* — LEE, HONG, DEGERMAN, KANG & WAIMEY

(57) ABSTRACT

A display device is disclosed. The display device may comprise: a flexible display panel; a panel roller which is elongated and around which the display panel is wound or unwound; a bottom frame having the panel roller rotatably mounted thereon; a first vertical frame elongated in a direction crossing the lengthwise direction of the panel roller, and fixed to the bottom frame; a first lead screw positioned adjacent and parallel to the first vertical frame and rotatably coupled to the bottom frame; a first gear box positioned adjacent to the first vertical frame and installed on the upper surface of the bottom frame; a second gear box installed on the lower surface of the bottom frame and rotating the first lead screw by receiving power from the first gear box; a first slider which moves on the first lead screw in the vertical direction according to the rotation of the first lead screw; and a bar to which the end portion of the display panel is fixed and which is coupled to the first slider.

14 Claims, 22 Drawing Sheets

DISPLAY DEVICE

CROSS-REFERENCE TO RELATED APPLICATIONS

This application is the National Stage filing under 35 U.S.C. 371 of International Application No. PCT/KR2020/006785, filed on May 26, 2020, the contents of which are all incorporated by reference herein in their entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

An OLED panel can display an image by depositing an organic material layer that can emit light by itself on a substrate on which a transparent electrode is formed. The OLED panel may have flexible characteristics as well as a thin thickness. The OLED panel having a flexible characteristic may display an image while being wound around or unwound from a roller.

Recently, a lot of research has been accomplished on a structural characteristic of a display device having such flexible panels.

DISCLOSURE

Technical Problem

The present disclosure has been made in view of the above problems, and provides a mechanism for stably winding or unwinding a flexible display panel.

The present disclosure further provides a frame structure that can be covered by a display panel or can be opened.

Technical Solution

In accordance with an aspect of the present disclosure, a display device includes: a flexible display panel; a panel roller which extends long, and around which the display panel is wound or from which the display panel is unwound; a bottom frame in which the panel roller is rotatably mounted; a first vertical frame which extends long in a direction intersecting a longitudinal direction of the panel roller, and is fixed to the bottom frame; a first lead screw which is located adjacent and parallel to the first vertical frame, and rotatably installed in the bottom frame; a first gearbox which is located adjacent to the first vertical frame, and mounted on an upper surface of the bottom frame; a second gearbox which is mounted on a lower surface of the bottom frame, and rotates the first lead screw by receiving power from the first gearbox; a first slider which moves in an up-downward direction in the first lead screw due to rotation of the first lead screw; and a bar to which a distal end of the display panel is fixed, and which is coupled to the first slider.

Advantageous Effects

According to at least one embodiment of the present disclosure, a mechanism for stably winding or unwinding a flexible display panel may be provided.

According to at least one embodiment of the present disclosure, a frame structure that can be covered by a display panel or can be opened may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
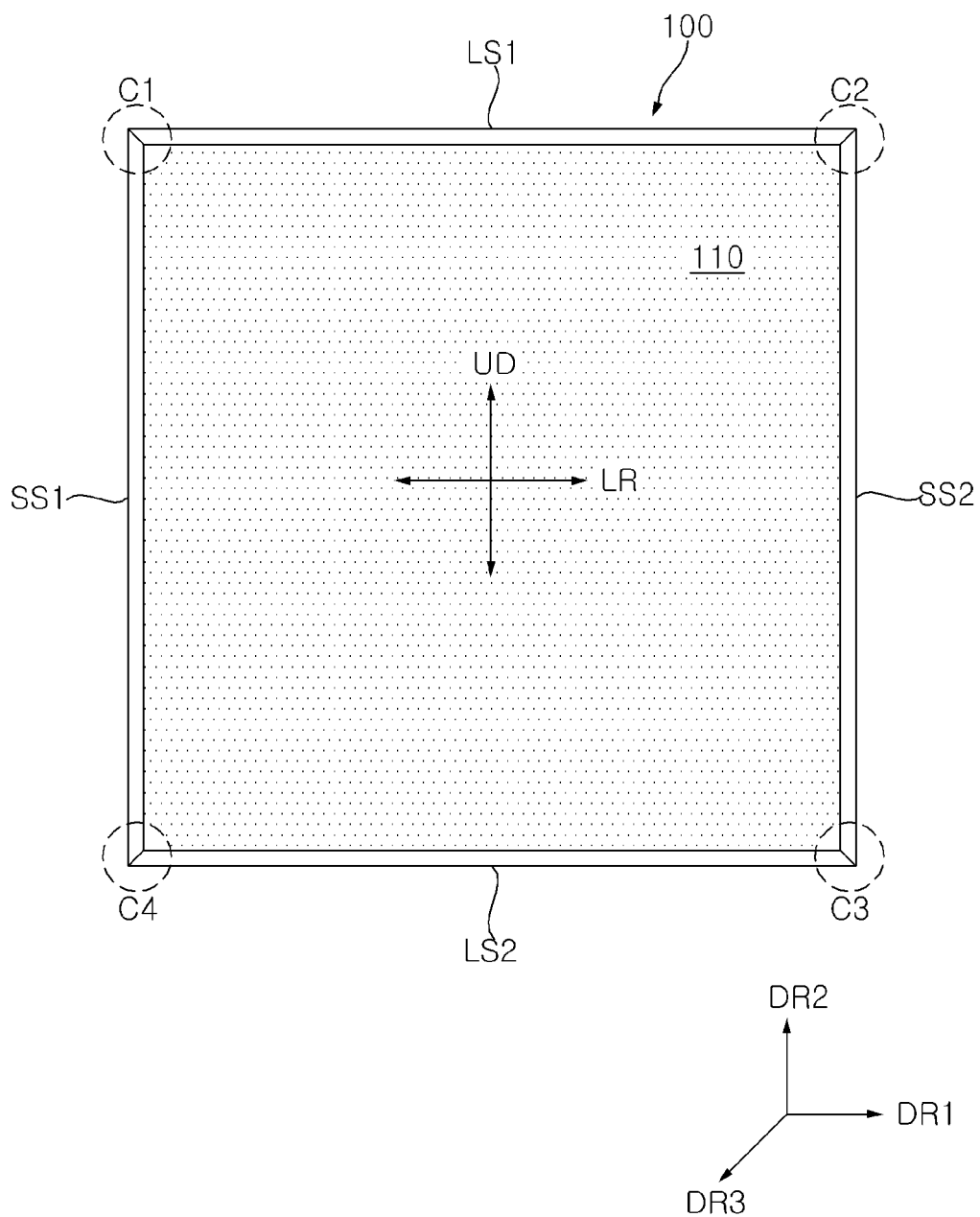
FIGS. 1 to 22 are diagrams illustrating examples of a display device according to embodiments of the present disclosure.

Referring to FIG. 1, a display device may include a first long side LS1, a second long side LS2 opposite the first long side LS1, a first short side SS1 adjacent to the first long side LS1 and the second long side LS2, and a second short side SS2 opposite the first short side SS1.

The first short side area SS1 of the display device may be referred to as a first side area, and the second short side area SS2 of the display device may be referred to as a second side area. The first long side area LS1 of the display device may be referred to as a third side area adjacent to the first side area and the second side area and located between the first side area and the second side area, and the second long side area LS2 of the display device may be referred to as a fourth side area adjacent to the first side area and the second side area, located between the first side area and the second side area, and opposite the third side area.

Although the length of the first and second long sides LS1 and LS2 is shown and described as being greater than the length of the first and second short sides SS1 and SS2 for convenience of description, the length of the first and second long sides LS1 and LS2 may be approximately equal to the length of the first and second short sides SS1 and SS2.

In the following description, a first direction DR1 may be a direction parallel to the long sides LS1 and LS2 of a display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be referred to as a horizontal direction. Further, the third direction DR3 may be referred to as a vertical direction.

When the display device is seen from the front or the front surface, the first long side portion LS1 may be referred to as an upper side or an upper surface, and the second long side portion LS2 may be referred to as a lower side or a lower surface. When the display device is seen from the front or the front surface, the first short side portion SS1 may be referred to as a left side or a left surface, and the second short side portion SS2 may be referred to as a right side or a right surface.

The first long side LS1, the second long side LS2, the first short side SS1, and the second short side SS2 may be referred to as edges of the display device. In addition, the points at which the first long side LS1, the second long side LS2, the first short side SS1, and the second short side SS2 join may be referred to as corners.

For example, the point at which the first long side LS1 and the first short side SS1 join may be referred to as a first corner C1, the point at which the first long side LS1 and the second short side SS2 join may be referred to as a second corner C2, the point at which the second short side SS2 and the second long side LS2 join may be referred to as a third corner C3, and the point at which the second long side LS2 and the first short side SS1 join may be referred to as a first corner C4.

A direction from the first short side SS1 to the second short side SS2 or a direction from the second short side SS2 to the first short side SS1 may be referred to as a left-rightward direction LR or a horizontal direction DR1. A direction from the first long side LS1 to the second long side LS2 or a direction from the second long side LS2 to the first long side LS1 may be referred to as an up-downward direction UD or a vertical direction DR2).

Figure 2:
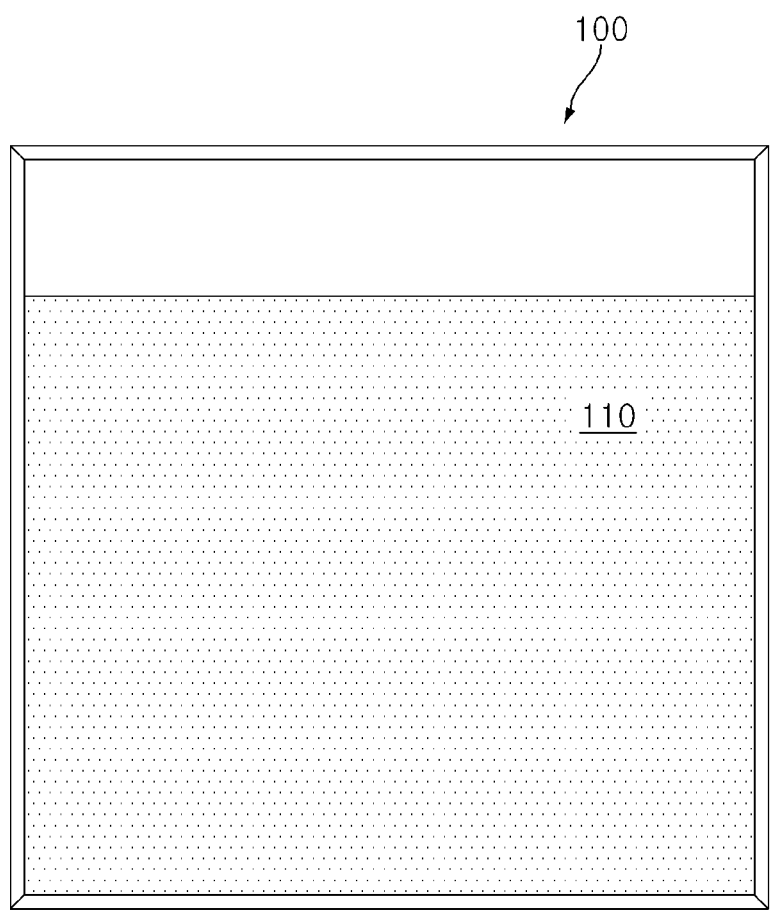
Figure 3:
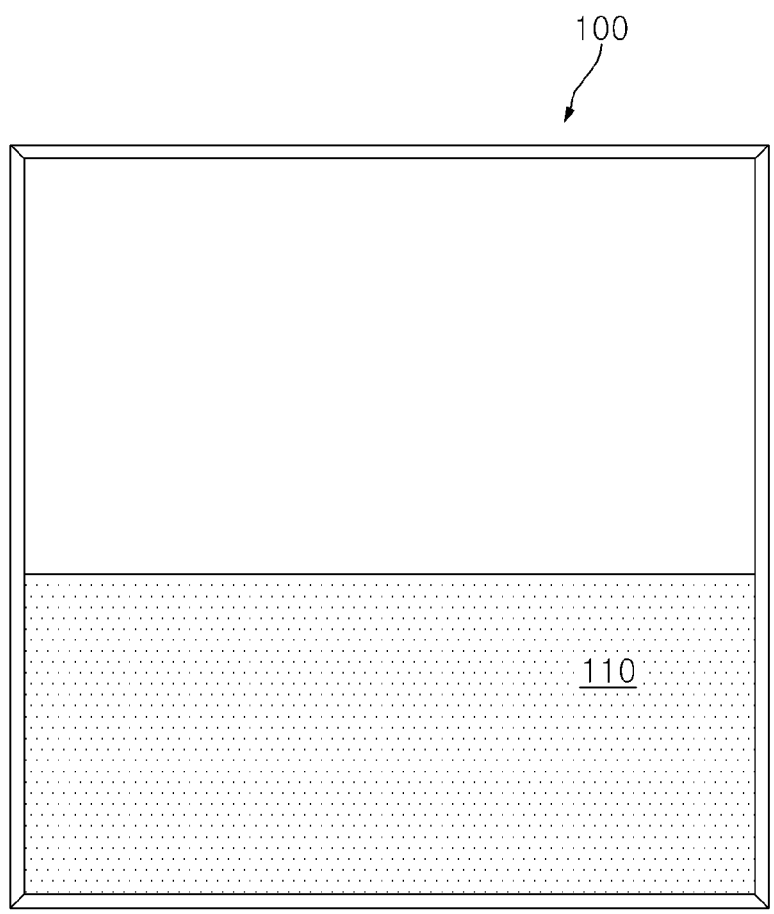

Referring to FIGS. 2 and 3, a display panel 110 may form the front surface of a display device 100, and may move in an up-downward direction.

The display panel 110 may cover the front surface of the display device 100 while ascending upward. The display panel 110 may expose the inside of the display device 100 to the outside while descending downward.

The display panel 110 may cover the front surface of the display device 100 while descending downward. The display panel 110 may expose the inside of the display device 100 to the outside while ascending upward.

Figure 4:
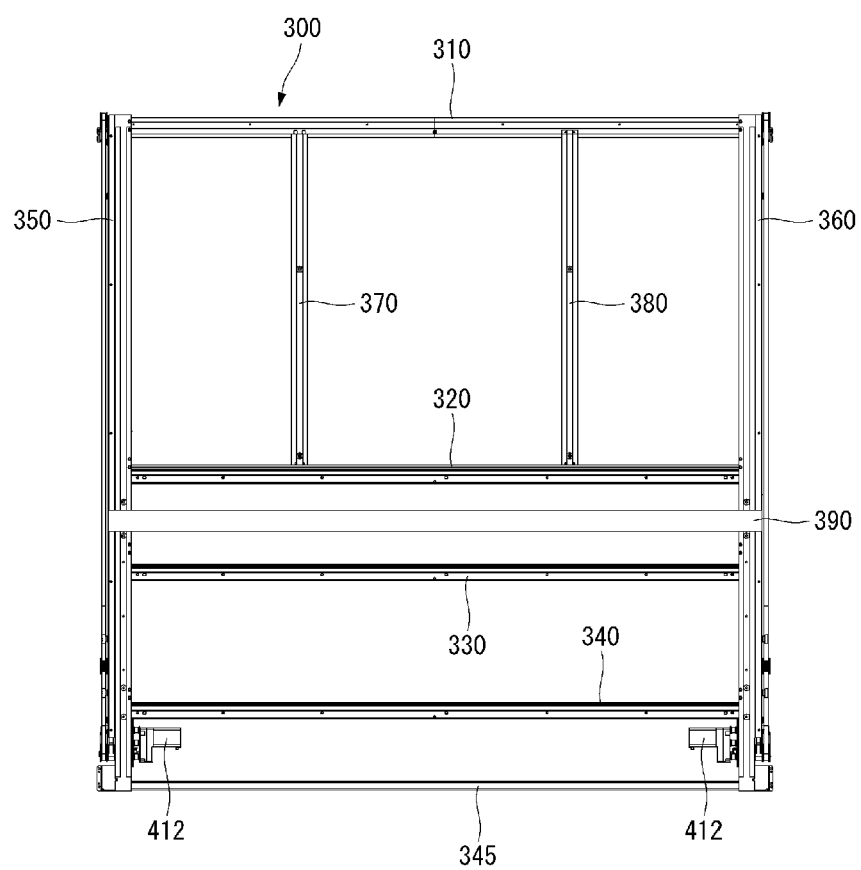
Figure 10:
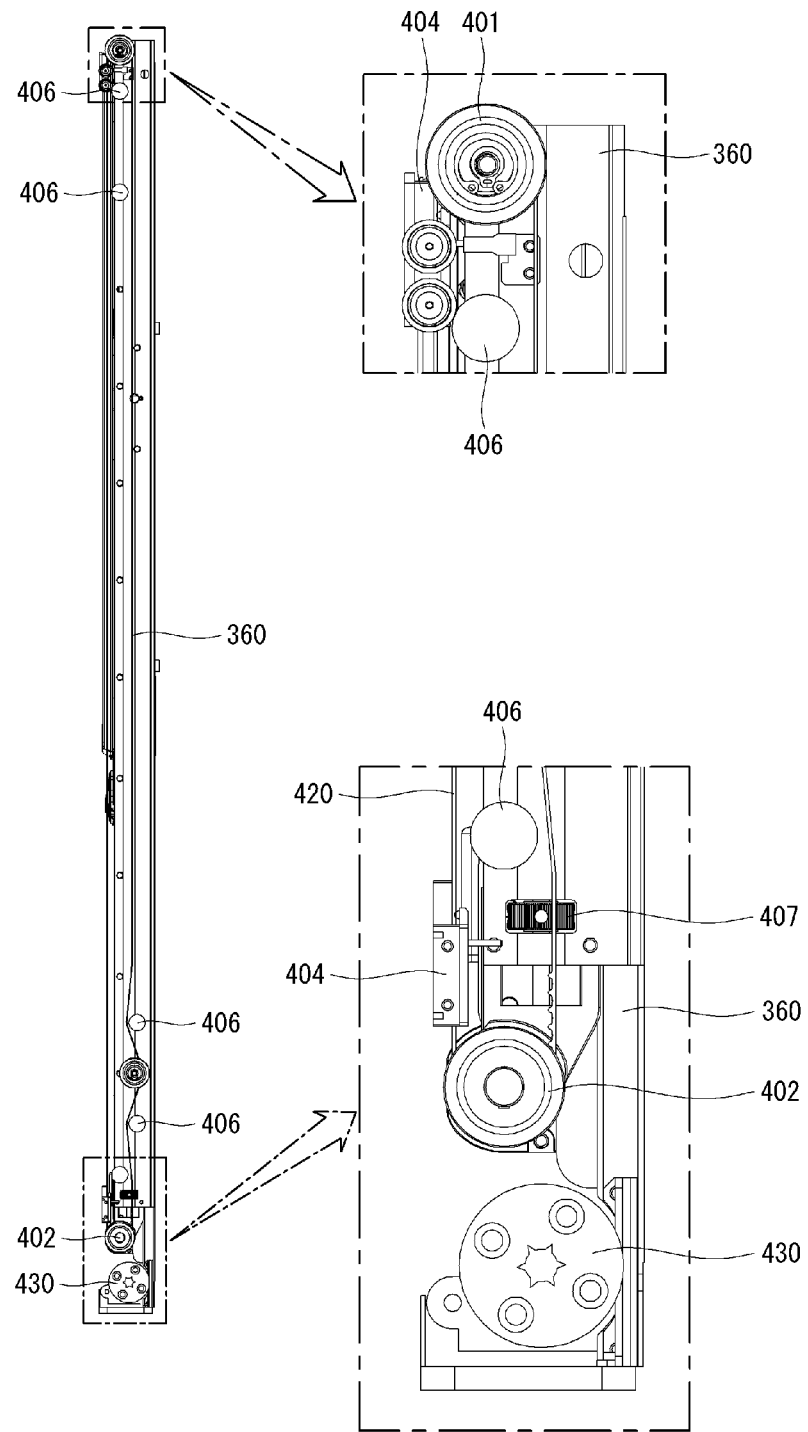

Referring to FIGS. 4 and 10, a frame 300 may form a skeleton of the display device 100 (refer to FIG. 1). The frame 300 may include a horizontal frame 310, 320, 330, and 340, and a vertical frame 350, 360, 370, and 380. There may be a plurality of horizontal frames 310, 320, 330, 340 and 345. There may be a plurality of vertical frames 350, 360, 370, and 380. The frames 300 may be coupled to each other.

A first horizontal frame 310 may be located in an upper side of the display device. A second horizontal frame 320 may be parallel to the first horizontal frame 310, and located below the first horizontal frame 310. A third horizontal frame 330 may be parallel to the second horizontal frame 320, and located below the second horizontal frame 320. A fourth horizontal frame 340 may be parallel to the third horizontal frame 330, and may be located below the third horizontal frame 330.

A first vertical frame 350 may be located in the left side of the first horizontal frame 310 to the fourth horizontal frame 340, and a second vertical frame 360 may be located in the right side of the first horizontal frame 310 to the fourth horizontal frame 340. A third vertical frame 370 and/or a fourth vertical frame 380 may connect the first horizontal frame 310 and the second horizontal frame 320 to each other.

A bar 390 may extend long from the first vertical frame 350 to the second vertical frame 360, and may move in the up-downward direction on the front surfaces of the first vertical frame 350 and the second vertical frame 360.

A bottom frame 345 may form a lower surface of the display device. The frames 300 may be coupled to the bottom frame 345.

Figure 5:
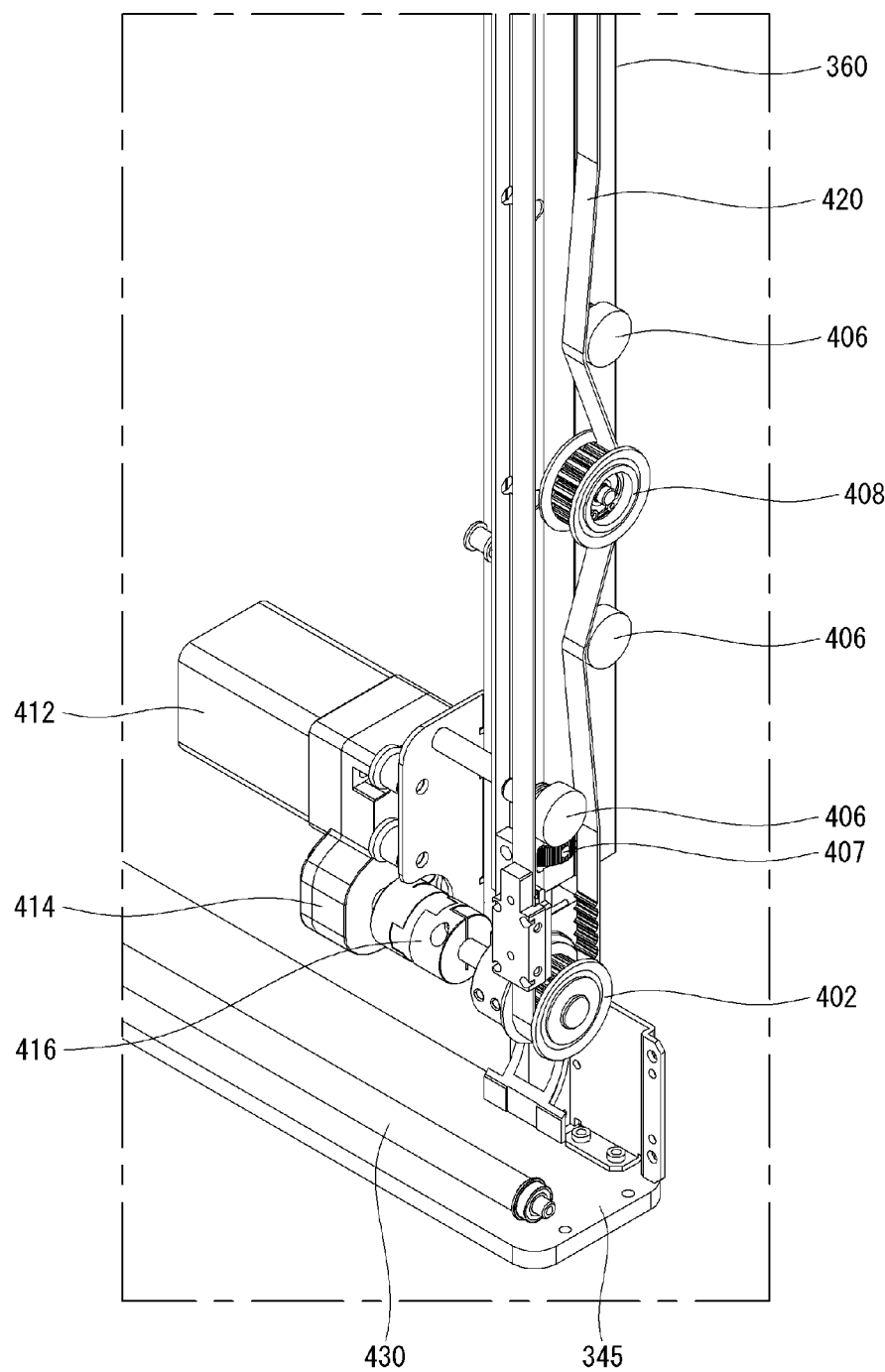

Referring to FIGS. 5 and 10, a motor 412 may be installed in the second vertical frame 360. The motor 412 may provide rotational force. A gearbox 414 may transmit the rotational force provided by the motor 412. One side of a joint 416 may be connected to the gearbox 414. The rotational force provided from the motor 412 may be transmitted to the joint 416 by adjusting the reduction ratio through the gearbox 414.

A pulley 402 may be rotatably mounted in the second vertical frame 360 while being adjacent to the motor 412. The pulley 402 may be referred to as a lower pulley 402. The pulley 408 may be installed on the second vertical frame 360 while being spaced apart from the lower pulley 402. The pulley 408 may be referred to as an intermediate pulley 408. The joint 416 may be connected to the pulley 402 to provide rotational force to the pulley 402. A plurality of tension rollers 406 may be installed along the longitudinal direction of the second vertical frame 360.

A slider 405 may be fixed on a belt 420. The slider 405 may move between the upper end and the lower end of the second vertical frame 360 according to the movement of the belt 420. A sensor 407 may be mounted on the second vertical frame 360 while being adjacent to the lower pulley 402. The sensor 407 may detect the movement of the slider 402. Accordingly, the movement of the display panel 110 (refer to FIGS. 1 to 3) according to the rotation of the belt 420 can be detected. The display panel 110 may be wound around a panel roller 430.

The same configuration and description may be applied to the first vertical frame 350.

Figure 6:
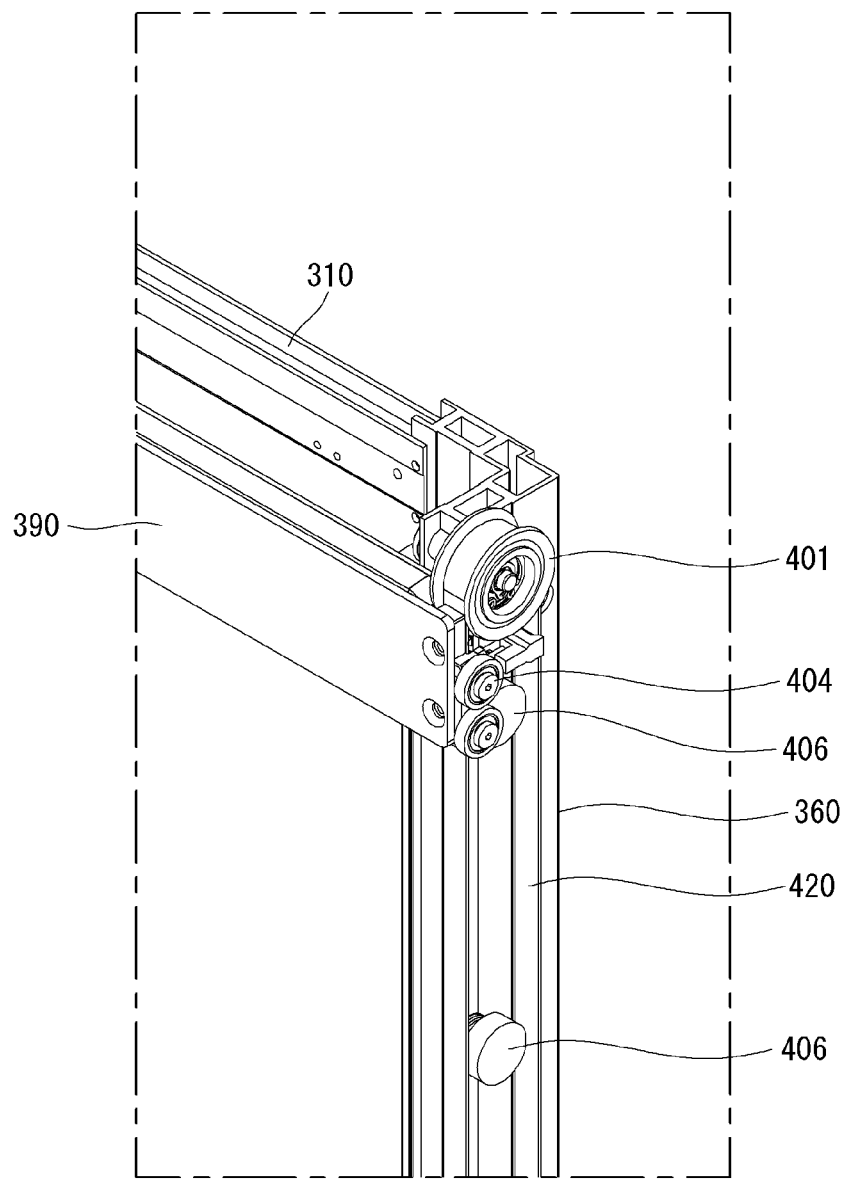

Referring to FIGS. 6 and 10, the pulley 401 may be rotatably mounted adjacent to the upper end of the second vertical frame 360. The pulley 401 may be referred to as an upper pulley 401. A plurality of tension rollers 406 may be installed along the longitudinal direction of the second vertical frame 360. The bar 390 may move on the second vertical frame 360. A guide roller 404 may be installed in one end and/or both ends of the bar 390. The guide roller 404 may move on the second vertical frame 360 together with the bar 390. An upper side of the display panel 110 (refer to FIGS. 1 to 3) may be fixed to the bar 390. The same configuration and description may be applied to the first vertical frame 350.

Referring to FIGS. 5, 6 and 10, the belt 420 may be caught on an upper pulley 401, an intermediate pulley 408, and/or a lower pulley 402. For example, belt 420 may be a timing belt. The belt 420 may be caught on the tension roller 406 while being caught on the pulleys 401, 402, and 408 to maintain tension. Accordingly, the belt 420 may maintain a constant tension. The same configuration and description may be applied to the first vertical frame 350.

Figure 7:
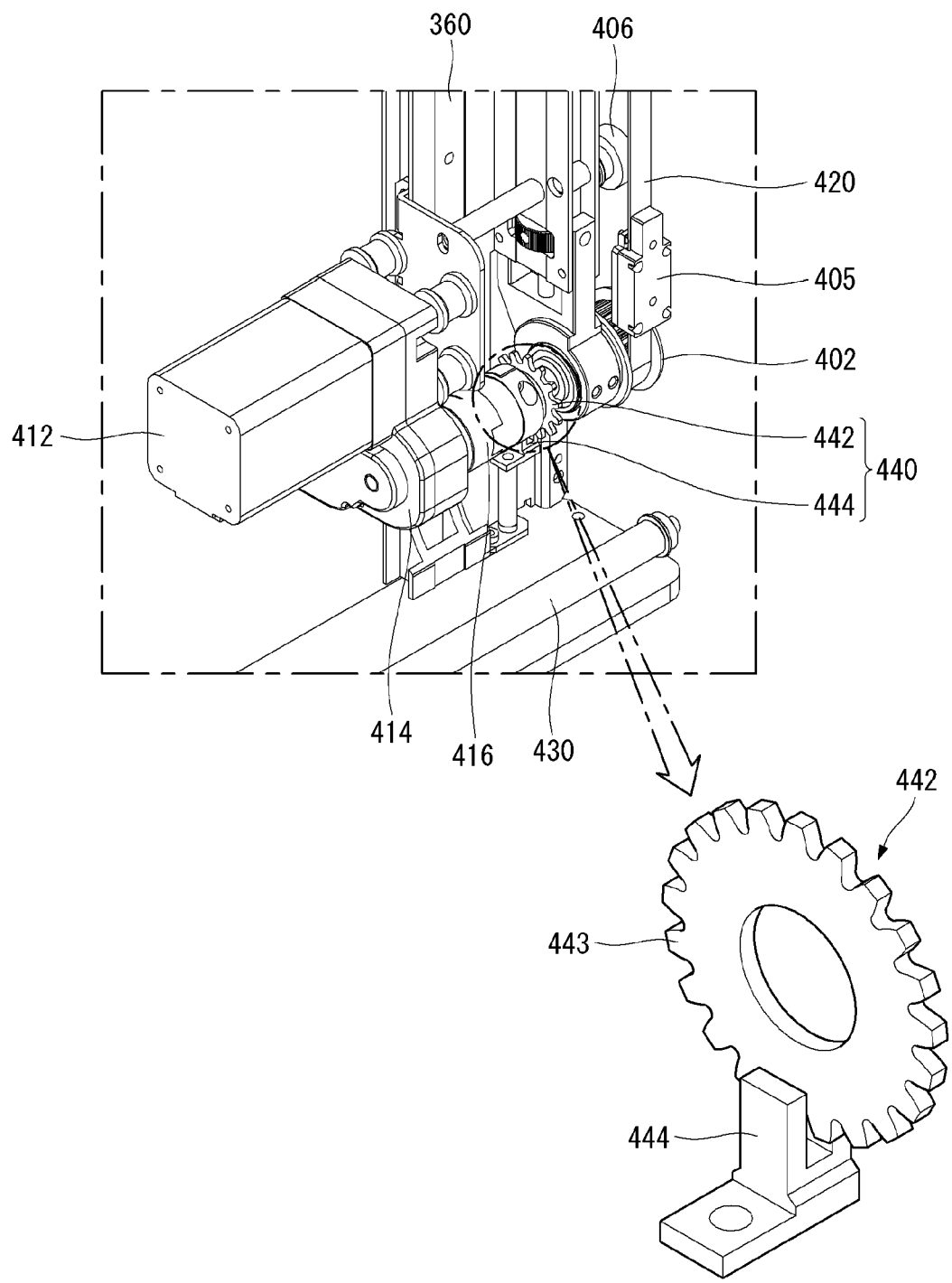

Referring to FIGS. 7 and 10, a rotator 440 may be located between the joint 416 and the pulley 402, and may rotate simultaneously with the rotation of the joint 416 and/or the pulley 402. The rotator 440 may include a plurality of protrusions 443 along a circumference. The sensor 444 may be installed in the second vertical frame 360 while being adjacent to the outer surface of the rotator 440. The sensor 444 may detect the rotation of the rotator 440. The same configuration and description may be applied to the first vertical frame 350. Accordingly, it is possible to synchronize the motors 412 installed in the left and right sides of the frame 300 (refer to FIG. 4).

Figure 8:
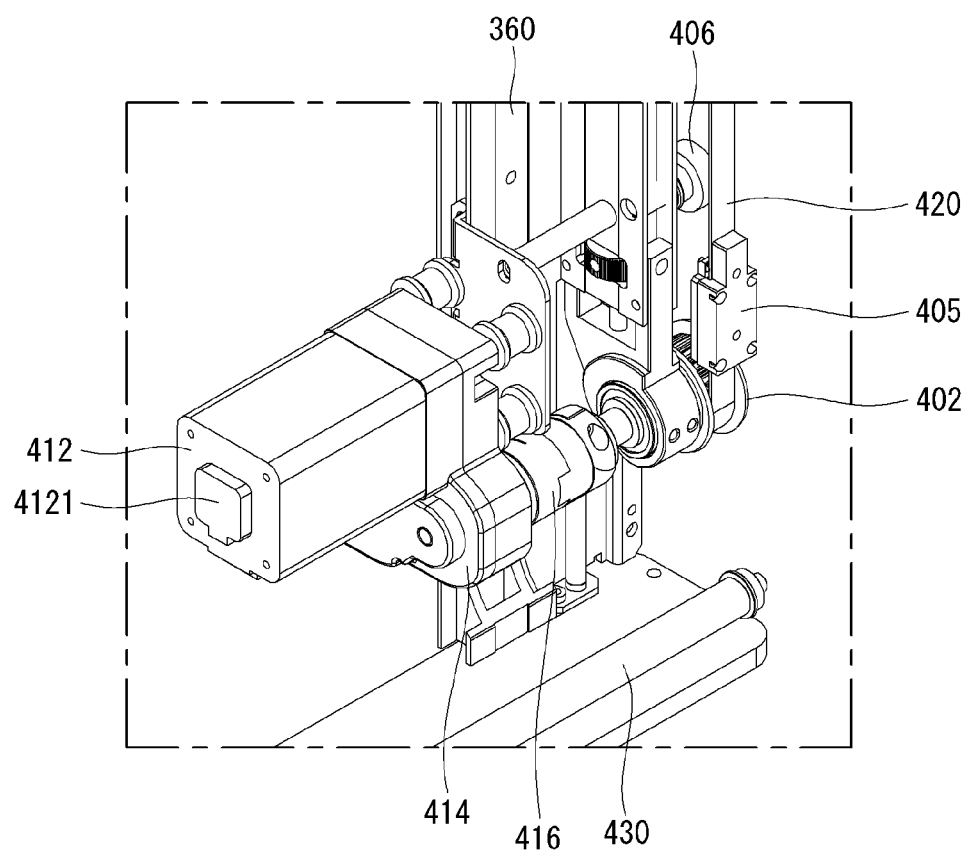

Referring to FIGS. 8 and 10, the motor 412 may be, for example, a step motor. An encoder 4121 may be installed in the motor 412. The encoder 4121 may control the rotation of the motor 412. The same configuration and description may be applied to the first vertical frame 350. Accordingly, it is possible to synchronize the motors 412 installed in the left and right sides of the frame 300 (refer to FIG. 4).

Figure 9:
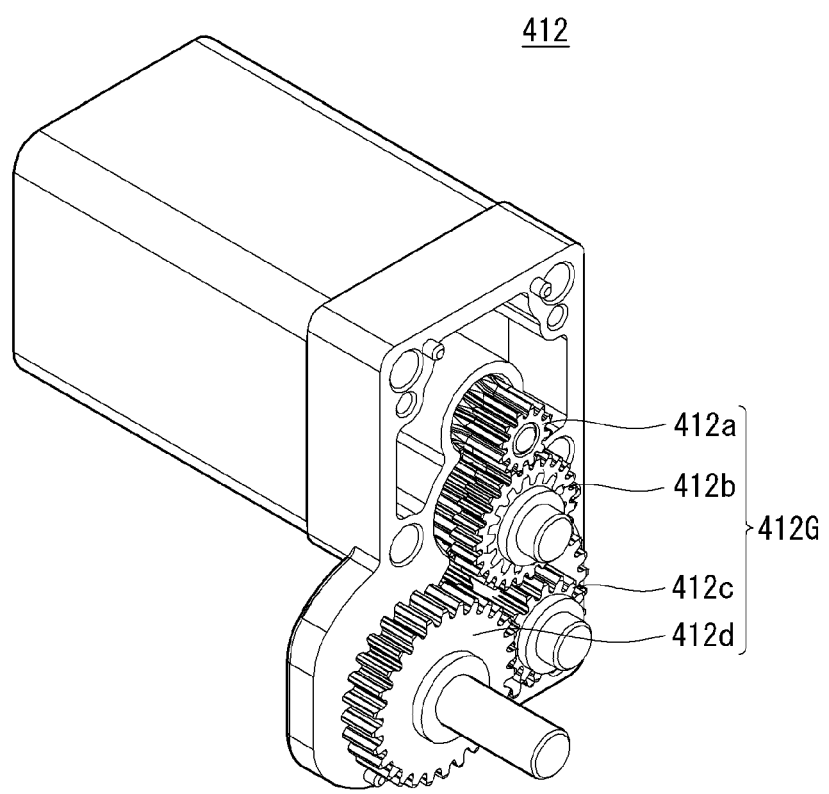

Referring to FIG. 9, the motor 412 may include gears 412G. The gears 412G may include a first gear 412a, a second gear 412b, a third gear 412c, and/or a fourth gear 412d. The first gear 412a may be connected or fixed to the rotation shaft of the motor 412.

For example, the gear ratio between the first gear 412a and the second gear 412b may be 2.08. As another example, the gear ratio between the second gear 412b and the third gear 412c may be 1.87. As another example, the gear ratio between the third gear 412c and the fourth gear 412d may be 1.87. The reduction ratio of the first gear 412a to the fourth gear 412d may be, for example, 7.2. The reduction ratio of the first gear 412a to the fourth gear 412d may be 6 to 8.

Figure 11:
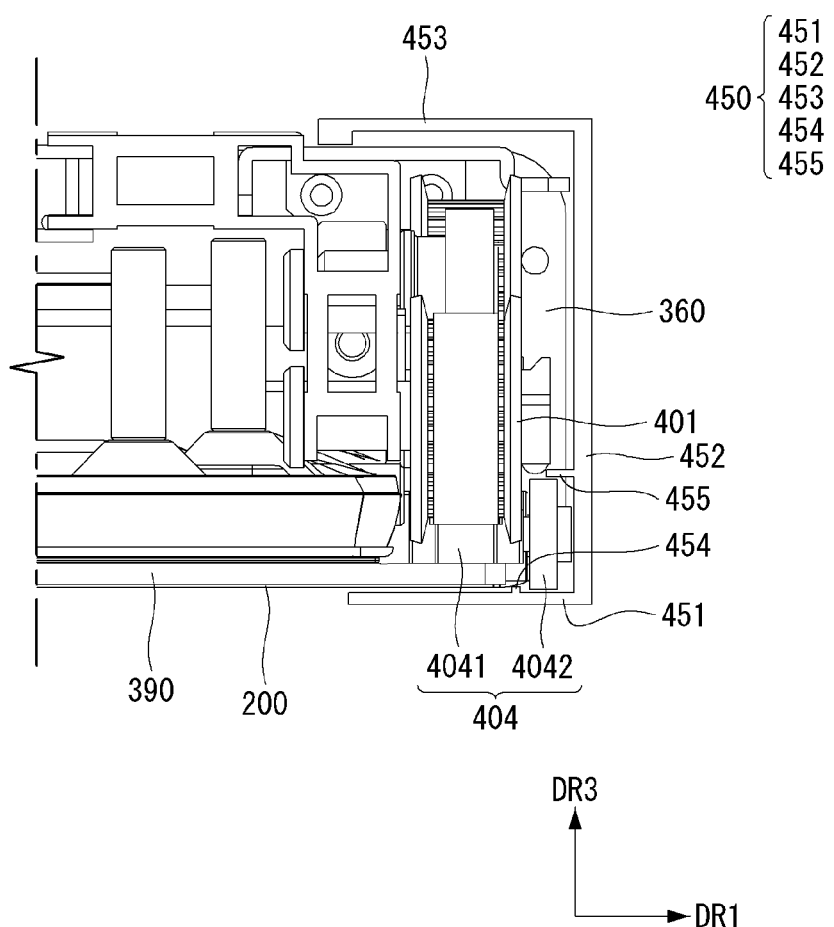

Referring to FIG. 11, a side cover 450 may cover the outer surface of the second vertical frame 360. The side cover 450 may include a first part 451, a second part 452, and a third part 453. The first part 451 may extend in a first direction DR1. The second part 452 may extend in a third direction DR3 and may be connected to the first part 451. The third part 453 may extend in the first direction DR1 and may be connected to the second part 452.

The first part 451 may cover a part of the front surface of the bar 390. The second part 452 may cover the outer surface of the second vertical frame 360. The third part 453 may be located in the rear of the second vertical frame 360.

The side cover 450 may include guide ribs 454 and 455. The guide ribs 454 and 455 may protrude inwardly of the first part 451 and/or the second part 452 while being adjacent to the guide roller 404. Accordingly, the movement of the bar 390 and the display panel 110 may be guided.

The same configuration and description may be applied to the first vertical frame 350.

Figure 12:
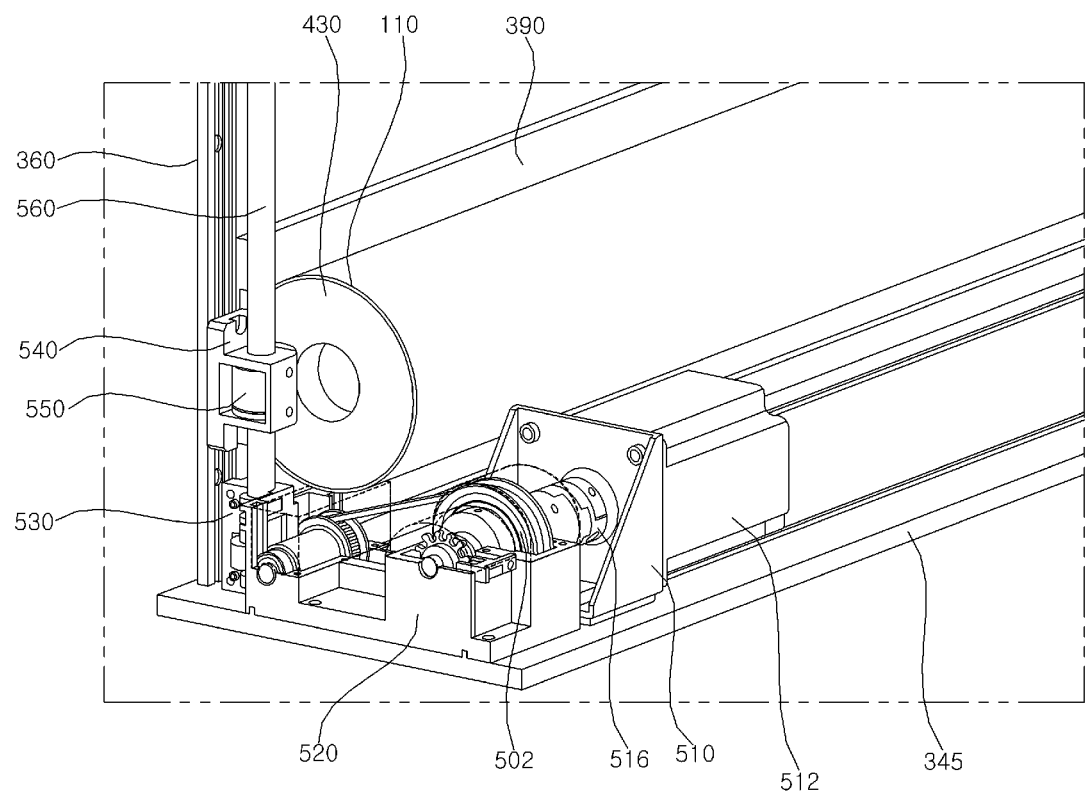

Referring to FIG. 12, a bracket 510 may be mounted on the bottom frame 345. The bracket 510 may be referred to as a motor bracket 510. The motor 512 may be located on the bottom frame 345 and may be fixed to the bracket 510. A pulley mount 520 may be mounted on the bottom frame 345. The pulley mount 520 may be located adjacent to the motor 512. The bracket 510 may be located between the pulley mount 520 and the motor 512.

The pulley 502 may be mounted on the pulley mount 520. The pulley 502 may rotate on the pulley mount 520. A joint 516 may connect the pulley 502 and the rotation shaft of the motor 512. The motor 512 may transmit power to the pulley 502 via joint 516. The pulley 502 may be referred to as a first pulley 502.

A screw 560 may be located parallel to the vertical frame 360. The lead screw 560 may be rotatably installed in the bottom frame 345. A screw mount 530 may be mounted on the bottom frame 345 while being adjacent to the vertical frame 360. The lead screw 560 may be rotatably coupled to the screw mount 530.

The lead screw 560 may be inserted into a slider 540. The slider 540 may move in the up-downward direction of the lead screw 560. The slider 540 may move in the up-downward direction while making contact with the vertical frame 360. The bar 390 may be connected to or coupled to the slider 540. The slider 540 may move in the up-downward direction along the lead screw 560 together with the bar 390.

A screw nut 550 may be coupled to the slider 540. The screw nut 550 may have a cylindrical shape and may have threads on its inner circumferential surface. The threads of the screw nut 550 may be engaged with threads formed on the outer circumferential surface of the lead screw 560. When the lead screw 560 rotates, the slider 540 may move in the up-downward direction of the lead screw 560 by the screw nut 550.

Figure 13:
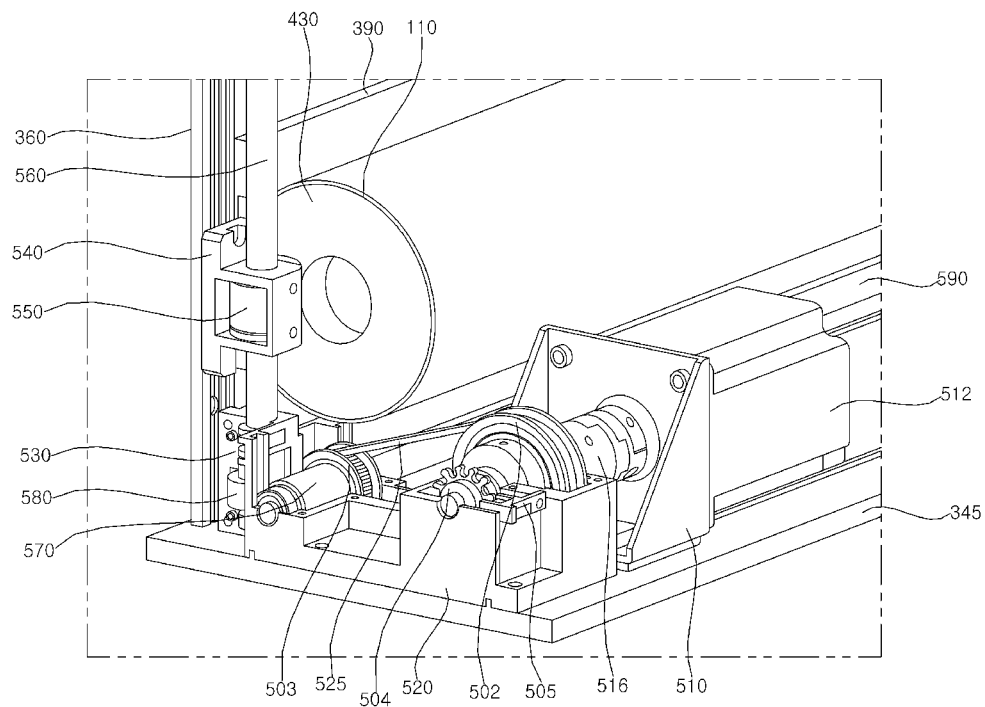

Referring to FIG. 13, an indicator 504 may be coupled to the rotation shaft of the first pulley 502. The indicator 504 may rotate with the first pulley 502. The sensor 505 may be mounted on the pulley mount 520 while being adjacent the indicator 504. The sensor 505 may detect the rotation of the indicator 504.

The second pulley 503 may be mounted in the pulley mount 520 while being spaced apart from the first pulley 502. A diameter of the second pulley 503 may be smaller than a diameter of the first pulley 502. The belt 525 may connect the first pulley 502 and the second pulley 503. The belt 525 may contact the outer circumferential surface of the first pulley 502 and the outer circumferential surface of the second pulley 503. When the first pulley 502 rotates, the second pulley 503 may also rotate by the belt 525.

A transmission shaft 590 may be inserted into the second pulley 503, and rotatably installed in the pulley mount 520. The transmission shaft 590 may be fixed to the second pulley 503 and rotate together with the second pulley 503. The transmission shaft 590 may be inserted into a worm 570. The worm 570 may be installed in the pulley mount 520 while being adjacent to the screw mount 530. The worm gear 580 may be fixed to the lower end of the lead screw 560. The worm gear 580 may be engaged with the worm 570.

Accordingly, the rotational force provided by the motor 512 may be transmitted to the lead screw 560 through the first pulley 502, the belt 525, the second pulley 503, the worm 570, and the worm gear 580.

Figure 14:
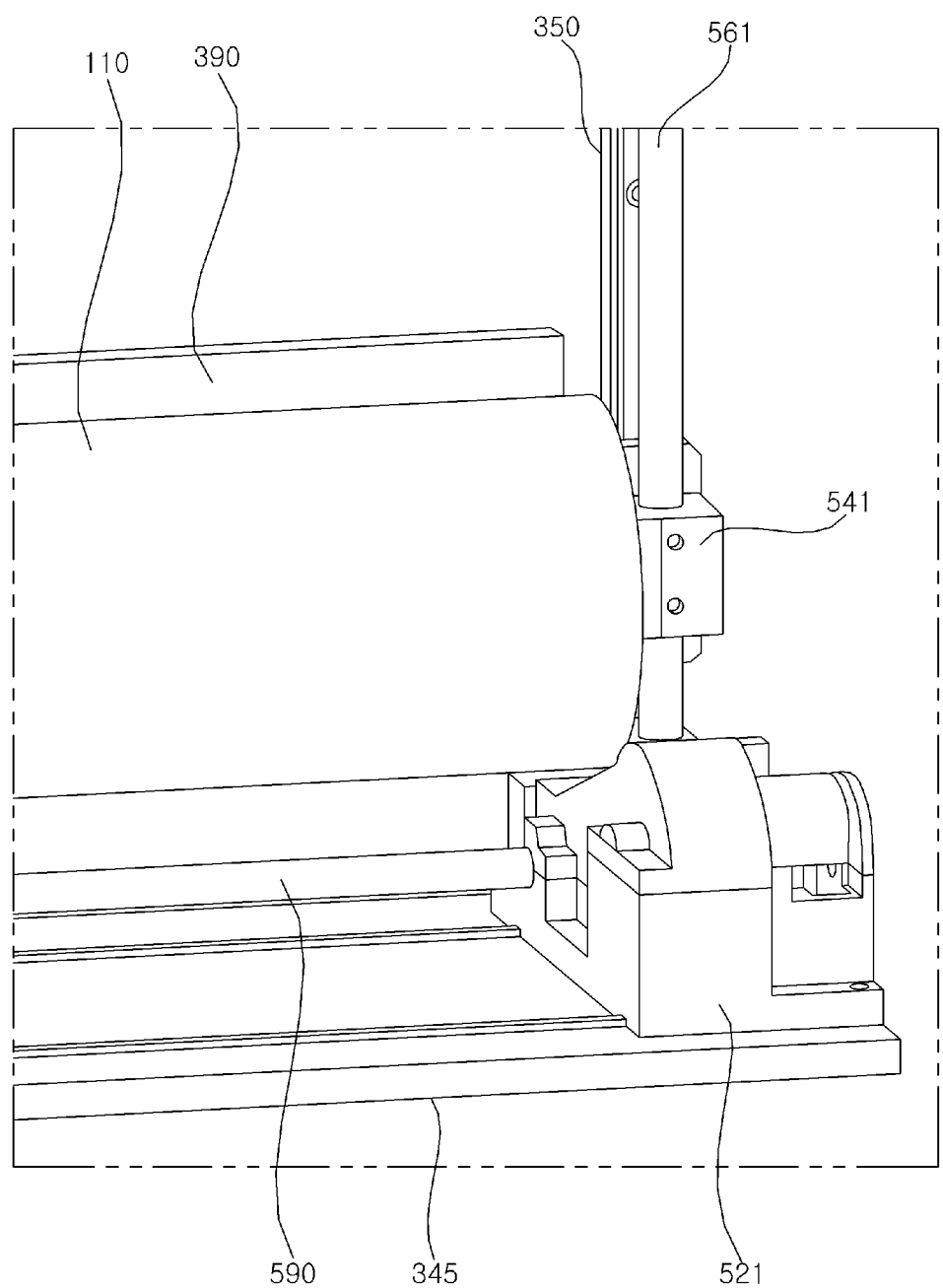

Referring to FIG. 14, the lead screw 561 may be located parallel to the vertical frame 350. The lead screw 561 may be rotatably installed in the bottom frame 345.

The lead screw 561 may be inserted into the slider 541. The slider 541 may move in the up-downward direction of the lead screw 561. The slider 541 may move in the up-downward direction while making contact with the vertical frame 350. The bar 390 may be connected to or coupled to the slider 541. The slider 541 may move in the up-downward direction along the lead screw 561 together with the bar 390.

The gearbox 521 may be mounted on the bottom mount 345. The gearbox 521 may connect the transmission shaft 590 and the lead screw 561. For example, the gearbox 521 may include a worm gear. The worm gear may transmit the rotational force of the transmission shaft 590 to the lead screw 561 to rotate the lead screw 561.

Figure 15:
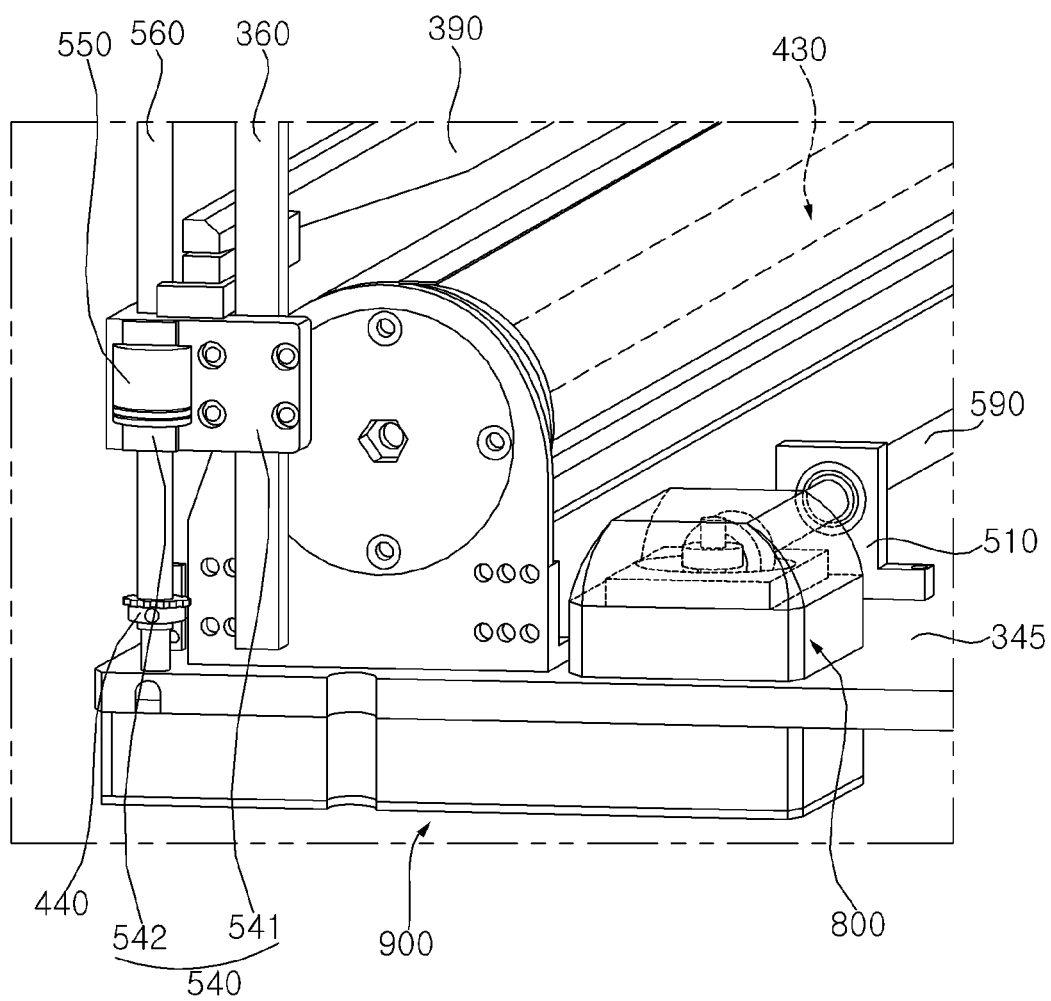
Figure 16:
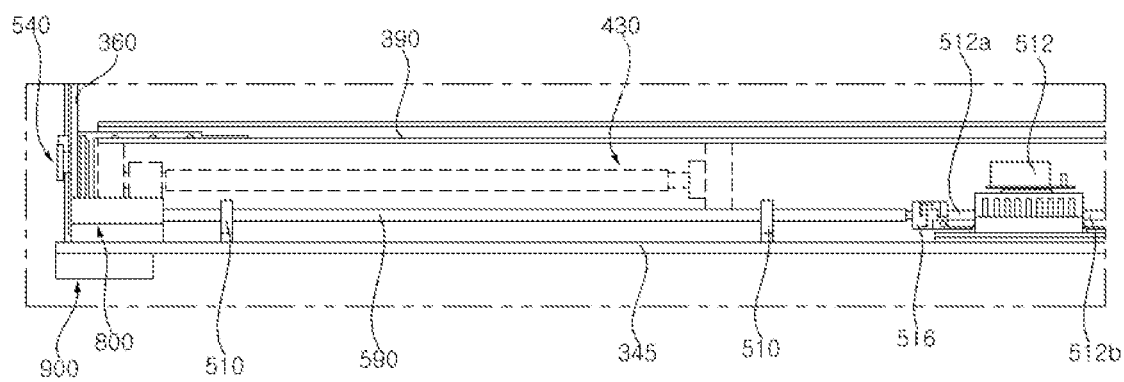

Referring to FIGS. 15 and 16, the panel roller 430 may be rotatably mounted on the bottom frame 345. The second vertical frame 360 may be located adjacent to a distal end of the panel roller 430, and may be fixed to the bottom frame 345. The motor 512 may be mounted on the bottom frame 345 while being adjacent to the center of the bottom frame 345 or adjacent to the center of the panel roller 430.

The transmission shaft 590 may extend long in the longitudinal direction of the bottom frame 345. The transmission shaft 590 may be supported by the brackets 510 and rotate in the bottom frame 345. The motor 512 may provide a rotational force to the transmission shaft 590. The motor shaft 512*a* (refer to FIG. 16) may protrude to one side of the motor 512 and rotate. The joint 516 may connect the motor shaft 512*a* (refer to FIG. 16) and the transmission shaft 590. The joint 516 may transmit the rotational force of the motor shaft 512*a* (refer to FIG. 16) to the transmission shaft 590. The motor shaft 512*b* may also protrude to the other side of the motor 512 and rotate.

The vertical frame 360 may be fixed to the bottom frame 345 while being adjacent to one end of the bottom frame 345. The vertical frame 360 may be located adjacent to the distal end of the panel roller 430.

The lead screw 560 may be located in front of the vertical frame 360. The lead screw 560 may be rotatably installed adjacent to a front corner of the bottom frame 345. The lead screw 560 may be installed on the bottom frame 345 while being in parallel with the vertical frame 360.

The slider 540 may move in the up-downward direction in the lead screw 560. The slider 540 may move on the lead screw 560 in the longitudinal direction of the lead screw 560. The bar 390 may be located in parallel with the panel roller 430. The bar 390 may be fixed to the slider 540.

The slider 540 may include a body 541 and a nut holder 542. The body 541 may be in contact with the vertical frame 360 and mat move up and down in the vertical frame 360. The nut holder 542 may be connected to the body 541. The screw nut 550 may be coupled to the nut holder 542.

A first gearbox 800 may be mounted on the upper surface of the bottom frame 345. A second gearbox 900 may be mounted on the lower surface of the bottom frame 345. The first gearbox 800 may face the second gearbox 900 with respect to the bottom frame 345. The transmission shaft 590 may provide a rotational force to the first gearbox 800. The first gearbox 800 may transmit power to the second gearbox 900. The second gearbox 900 may rotate the lead screw 560.

Figure 17:
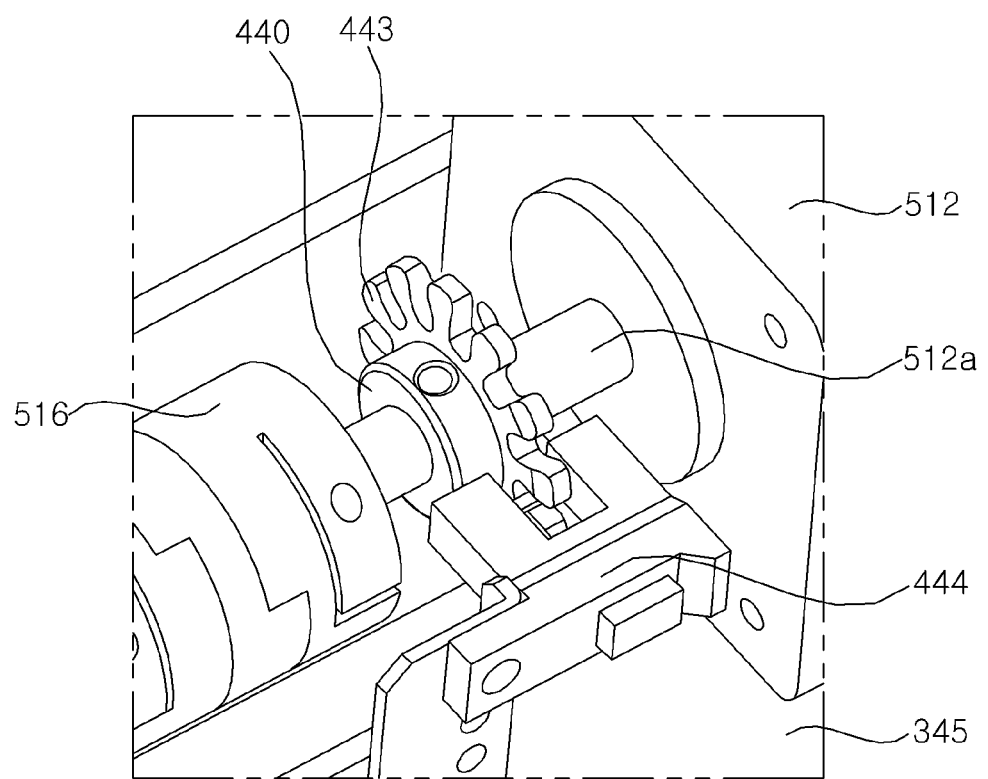

Referring to FIGS. 16 and 17, the motor 512 may include a plurality of motor shafts 512*a* and 512*b*. The rotation of the motor 512 may be distributed and transmitted to both sides of the motor 512. A first motor shaft 512*a* may be connected to the first joint 516. A second motor shaft 512*b* may be connected to the second joint 516. The rotator 440 may be fixed to the first motor shaft 512*a*. When the first motor shaft 512*a* rotates, the rotator 440 may also rotate. The rotator 440 may include a plurality of protrusions 443. For example, the rotator 440 may be a disk, and the plurality of protrusions 443 may be formed on the outer circumferential surface of the rotator 440. The sensor 444 may be located adjacent to the rotator 440. The sensor 444 may detect the rotation of the rotator 440.

Figure 18:
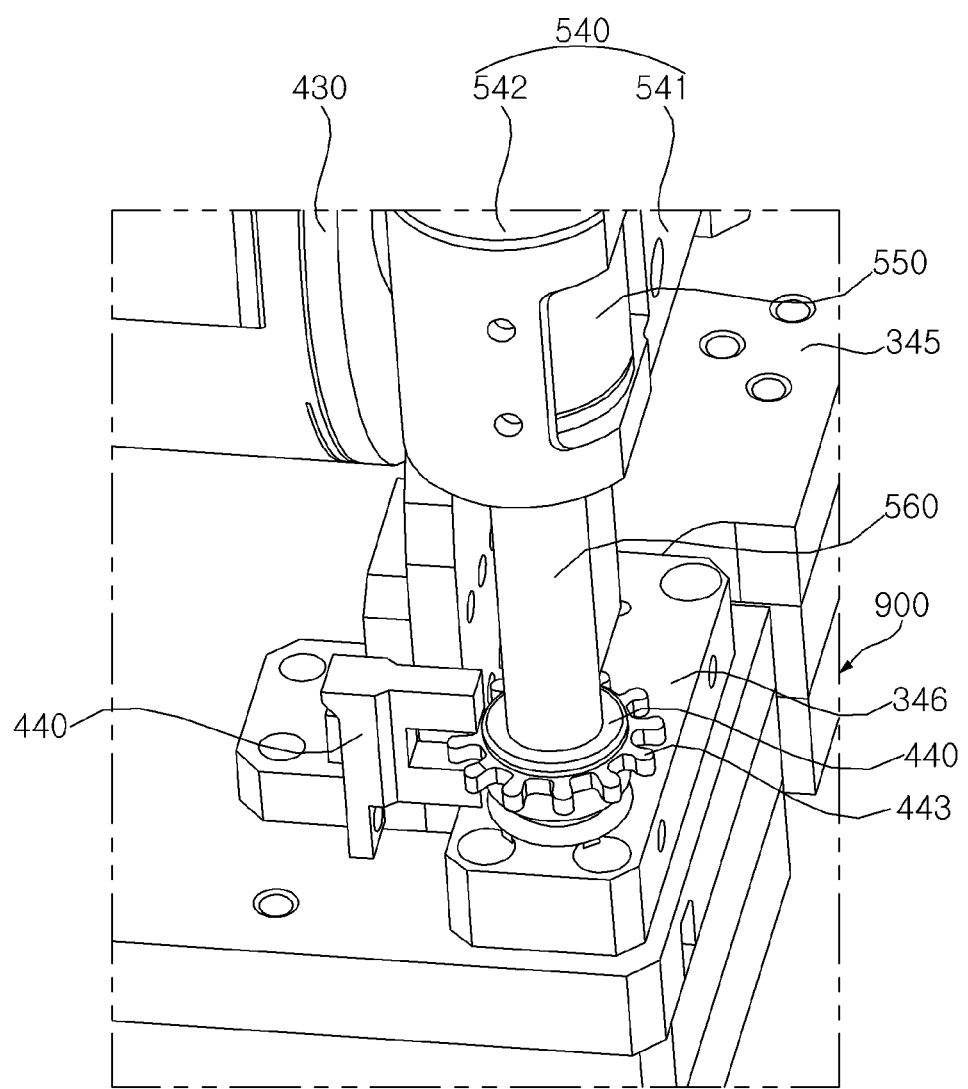

Referring to FIG. 18, a screw mount 346 may be mounted on the bottom plate 345. The lead screw 560 may be rotatably installed on the screw mount 346. The rotator 440 may be fixed to the lead screw 560. The rotator 440 may include protrusions 443. The protrusions 443 may protrude from the outer circumferential surface of the rotator 440. The protrusions 443 may be sequentially disposed in the circumferential direction of the rotator 440. The sensor 444 may be located adjacent to the rotator 440. The sensor 444 may detect the rotation of the rotator 440.

Figure 19:
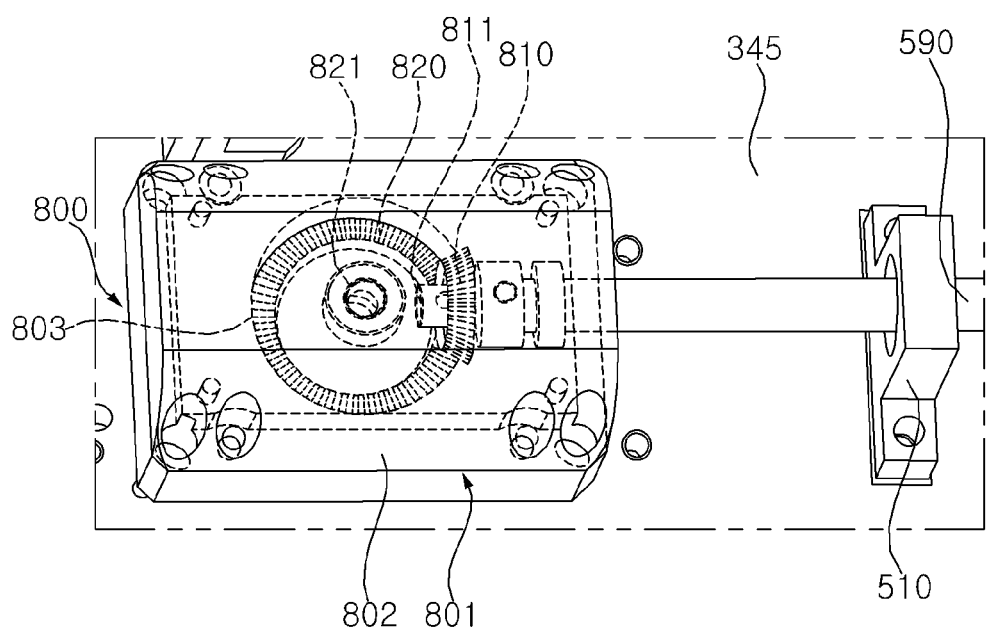

Referring to FIG. 19, the first gearbox 800 may include a case 801, 802 and a bevel gear set 810, 820. The case 801, 802 may include a base 801 and a cover 802. The base 801 may be fixed on the bottom plate 345. The base 801 may include a gear hole 803. The gear hole 803 may have a circular shape formed to penetrate the base 801. The gear hole 803 may be located in the opening of the bottom plate 345, and the gear hole 803 may be formed to penetrate the bottom plate 345.

A first bevel gear 810 may be fixed to the transmission shaft 590. A second bevel gear 820 may be located in the lower side of the base 801, and may be engaged with the first bevel gear 810 through the gear hole 803. A rotation shaft 811 of the first bevel gear 810 may intersect a rotation shaft 821 of the second bevel gear 820. For example, the rotation shaft 811 of the first bevel gear 810 may be perpendicular to the rotation shaft 821 of the second bevel gear 820.

Figure 20:
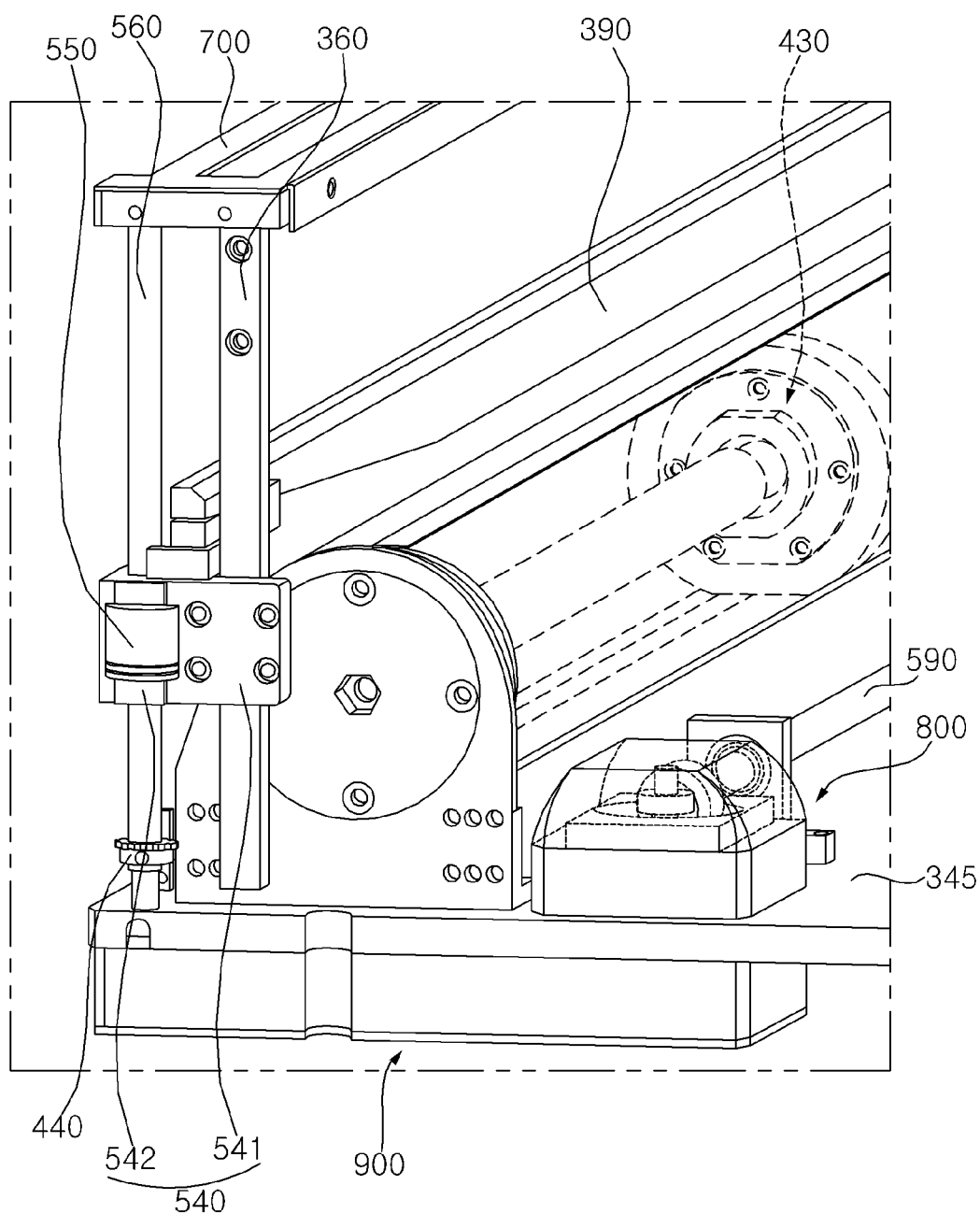
Figure 21:
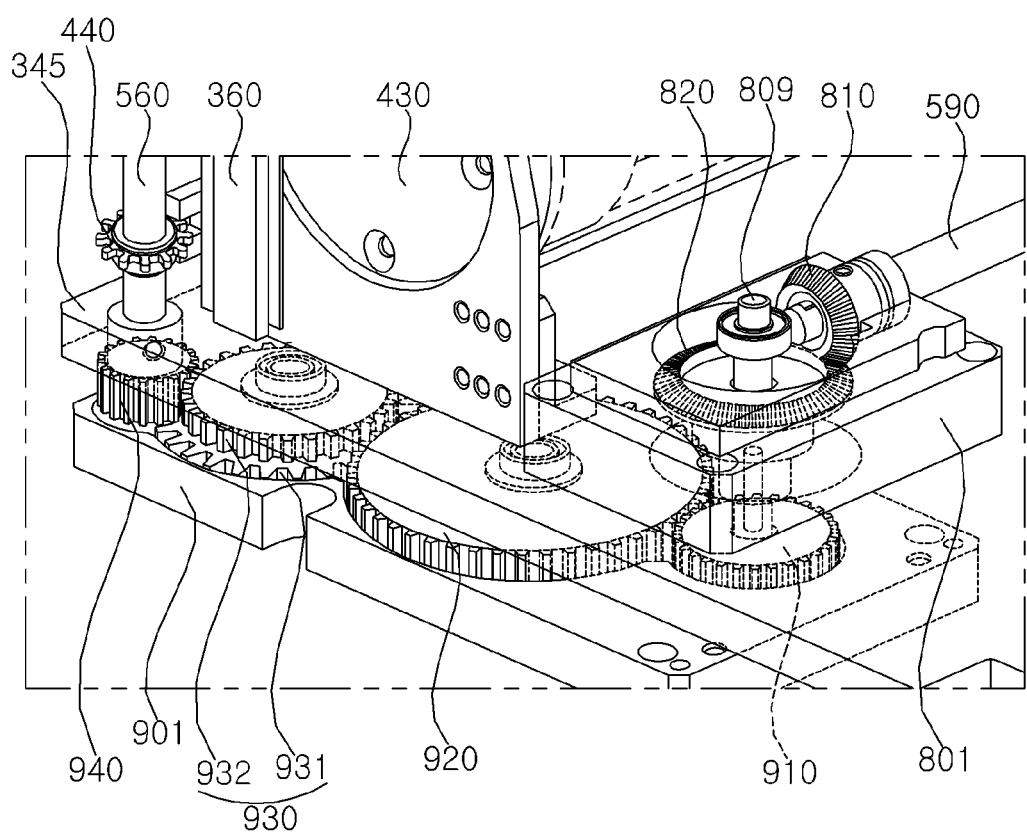

Referring to FIGS. 20 and 21, a top block 700 may be placed on the side frame 360 and the lead screw 560. The top block 700 may be coupled to the side frame 360 and the lead screw 560. The slider 540 may move up and down in the lead screw 560 while the upper surface of the rotator 440 is set as a bottom dead center and the lower surface of the top block 700 is set as a top dead center. At this time, the slider 540 may contact the vertical frame 360.

A case 901 of the second gearbox 900 may be mounted on the lower surface of the bottom frame 345. The second gearbox 900 may receive power from the first gearbox 800. The second gearbox 900 may transmit power to the lead screw 560. When the transmission shaft 590 rotates, rotational force is transmitted through the first gearbox 800 and the second gearbox 900 to rotate the lead screw 560. When the lead screw 560 rotates, the screw nut 550 may move upward or downward in the lead screw 560, and the bar 390 may move between the top dead center and the bottom dead center.

The second gear box 900 may include a first gear 910, a second gear 920, a third gear 930, and a fourth gear 940. The first gear 910 may rotate together with the second bevel gear 820. A bevel shaft 809 may be inserted into the rotation center of the second bevel gear 820 and the first gear 910. The bevel shaft 809 may connect the second bevel gear 820 and the first gear 910. The first gear 910 may be located downwardly of the second bevel gear 820. The first gear 910 may overlap the second bevel gear 820 in the direction of the rotation shaft.

The second gear 920 may be rotatably installed inside the second gearbox 900. The second gear 920 may be engaged with the first gear 910. The diameter of the second gear 920 may be greater than the diameter of the first gear 910.

The third gear 930 may be rotatably installed inside the second gearbox 900. The third gear 930 may be engaged with the second gear 920. The third gear 930 may be engaged with the fourth gear 940. The third gear 930 may include a primary gear 931 and a secondary gear 932. The diameter of the primary gear 931 may be greater than the diameter of the secondary gear 932. The primary gear 931 may be engaged with the second gear 920, and the secondary gear 932 may be engaged with the fourth gear 940.

The fourth gear 940 may rotate together with the lead screw 560. The rotation shaft of the lead screw 560 may be inserted into the fourth gear 940. The lead screw 560 may be coupled to the fourth gear 940 by penetrating the bottom frame 345. The diameter of the fourth gear 940 may be smaller than the diameter of the secondary gear 932 of the third gear 930.

The power provided from the motor 512 (refer to FIG. 16) may be transmitted to the lead screw 560 through the first bevel gear 810, the second bevel gear 820, the first gear 910, the second gear 920, the third gear 930, and the fourth gear 940.

Figure 22:
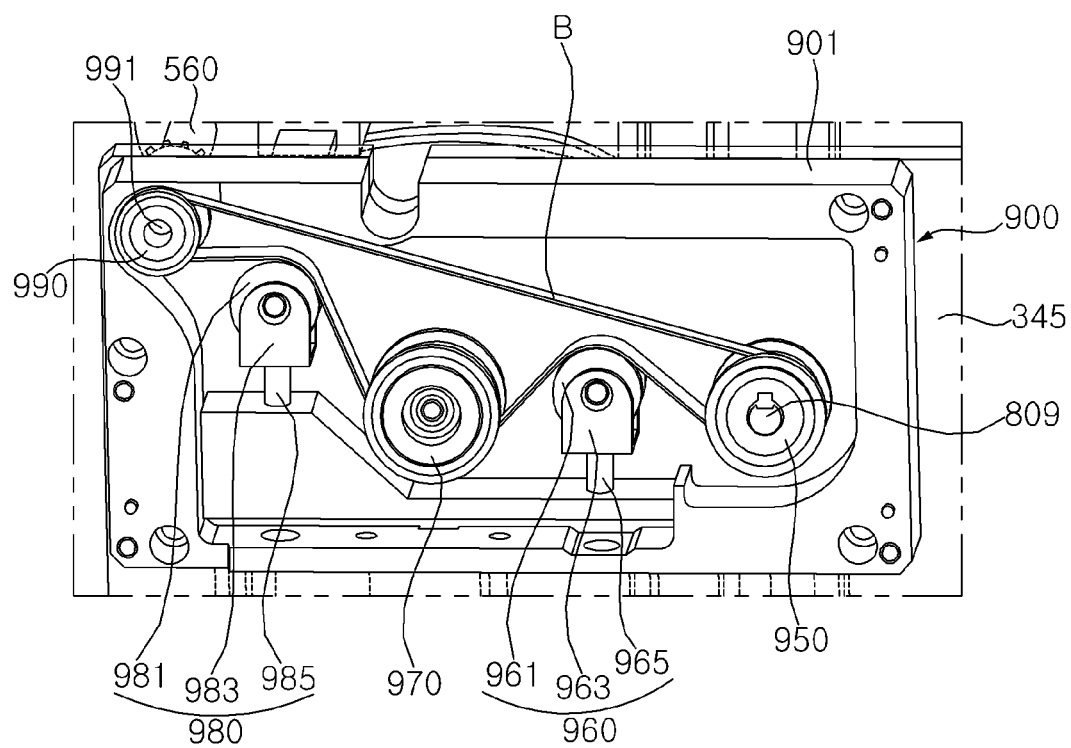

Referring to FIGS. 20 and 22, the case 901 of the second gearbox 900 may be mounted or fixed to the lower surface of the bottom frame 345. A first roller 950 may be rotatably installed in the case 901. The rotation shaft 809 of the first roller 950 may be the rotation shaft 809 of the second bevel gear 820 (refer to FIG. 21). The first roller 950 may rotate together with the second bevel gear 820 (refer to FIG. 21).

A third roller 990 may be rotatably installed in the case 901. The lead screw 560 may penetrate the bottom frame 345 and be inserted and fixed into the third roller 990. The rotation shaft 991 of the third roller 990 may be a central axis of the lead screw 560. The third roller 990 may rotate together with the lead screw 560. For example, the diameter of the third roller 990 may be smaller than the diameter of the first roller 950.

The second roller 970 may be located between the first roller 950 and the third roller 990. The second roller 970 may be rotatably installed in the case 901. For example, the diameter of the second roller 970 may be larger than the diameter of the first roller 950.

A belt B may be wound around the first roller 950, the second roller 970, and/or the third roller 990. When the first roller 950 rotates, the second roller 970 and/or the third roller 990 may rotate by the belt B.

A first tension roller 960 may be located between the first roller 950 and the second roller 970. The first tension roller 960 may include a roller 961, a spoke 963, and a rod 965. The rod 965 may be fixed to the case 901. The spoke 963 may be coupled or fixed to the rod 965. The roller 961 may be rotatably coupled to the spoke 963. The first tension roller 960 may allow a belt B between the first roller 950 and the second roller 970 to be close to a belt B between the first roller 950 and the third roller 980.

A second tension roller 980 may be located between the second roller 970 and the third roller 990. The second tension roller 980 may include a roller 981, a spoke 983, and a rod 985. The rod 985 may be fixed to the case 901. The spokes 983 may be coupled or fixed to the rod 985. The roller 981 may be rotatably coupled to the spoke 983. The second tension roller 980 may allow the belt B between the second roller 970 and the third roller 990 to be close to the belt B between the first roller 950 and the third roller 990. The tension rollers 960 and 980 may increase the tension of the belt B.

Power provided from the motor 512 (refer to FIG. 16) may be transmitted to the lead screw 560 through the first roller, the first tension roller, the second roller, the second tension roller, and the third roller.

According to an aspect of the present disclosure, there is provided a display device including: a flexible display panel; a panel roller which extends long, and around which the display panel is wound or from which the display panel is unwound; a bottom frame in which the panel roller is rotatably mounted; a first vertical frame which extends long in a direction intersecting a longitudinal direction of the panel roller, and is fixed to the bottom frame; a first lead screw which is located adjacent and parallel to the first vertical frame, and rotatably installed in the bottom frame; a first gearbox which is located adjacent to the first vertical frame, and mounted on an upper surface of the bottom frame; a second gearbox which is mounted on a lower surface of the bottom frame, and rotates the first lead screw by receiving power from the first gearbox; a first slider which moves in an up-downward direction in the first lead screw due to rotation of the first lead screw; and a bar to which a distal end of the display panel is fixed, and which is coupled to the first slider.

According to another aspect of the present disclosure, the display device further includes a motor which is located in a rear of the panel roller, and mounted on the bottom frame; and a transmission shaft which has one end connected to the motor and the other end connected to the first gearbox.

According to another aspect of the present disclosure, the display device further includes a first bevel gear fixed to the other end of the transmission shaft; and a second bevel gear which is engaged with the first bevel gear, and transmits power to the second gearbox.

According to another aspect of the present disclosure, the second gearbox includes: a first gear facing the second bevel gear with respect to the bottom frame; at least one gear engaged with the first gear; and a fourth gear which is engaged with the at least one gear, and rotates together with the first lead screw inserted therein, wherein the first gear to which a bevel shaft, which is a rotation shaft of the second bevel gear, is inserted and fixed.

According to another aspect of the present disclosure, a diameter of the fourth gear is smaller than a diameter of the first gear.

According to another aspect of the present disclosure, the at least one gear includes: a second gear engaged with the first gear; and a third gear engaged with the second gear and the fourth gear, wherein a diameter of the third gear is greater than a diameter of the first gear, and a diameter of the second gear is larger than the diameter of the third gear.

According to another aspect of the present disclosure, the second gearbox includes: a first roller facing the second bevel gear with respect to the bottom frame; a third roller rotating together with the first lead screw; and a belt wound around the first roller and the third roller, wherein the first roller to which a bevel shaft, which is a rotation shaft of the second bevel gear, is inserted and fixed.

According to another aspect of the present disclosure, the second gearbox includes: a second roller which is located between the first roller and the third roller, and around which the belt is wound; a first tension roller which is located between the first roller and the second roller and pushes the belt; and a second tension roller which is located between the second roller and the third roller and pushes the belt.

According to another aspect of the present disclosure, the first tension roller pushes a belt between the first roller and the second roller to be close to a belt between the first roller and the third roller, and the second tension roller pushes a belt between the second roller and the third roller to be close to the belt between the first roller and the third roller.

According to another aspect of the present disclosure, the display device further includes a second vertical frame which faces the first vertical frame with respect to the panel roller, and is fixed to the bottom frame; a second lead screw which is located adjacent and parallel to the second vertical frame, and rotatably installed in the bottom frame; a third gearbox which is located adjacent to the second vertical frame, and mounted on an upper surface of the bottom frame; a fourth gearbox which is mounted on a lower surface of the bottom frame, and rotates the second lead screw by receiving power from the third gearbox; a second slider which moves in an up-downward direction in the second lead screw due to rotation of the second lead screw; and a bar to which a distal end of the display panel is fixed, and which is coupled to the first slider and the second slider.

According to another aspect of the present disclosure, the transmission shaft is a first transmission shaft, the display device further includes a second transmission shaft having one end connected to the motor and the other end connected to the third gearbox, wherein the second slider moves in an up-downward direction in the second lead screw while the second lead screw rotates as rotational force provided by the motor is transmitted through the second transmission shaft, the third gearbox, and the fourth gearbox.

According to another aspect of the present disclosure, the first slider is in contact with the first vertical frame while moving in the first lead screw, and the second slider is in contact with the second vertical frame while moving in the second lead screw.

According to another aspect of the present disclosure, the display device further includes a rotator fixed to the first lead screw or the second lead screw; and a sensor which is located adjacent to the rotator, and detects rotation of the rotator.

According to another aspect of the present disclosure, the display device further includes a rotator fixed to the first transmission shaft or the second transmission shaft; and a sensor which is located adjacent to the rotator, and detects rotation of the rotator.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
    a flexible display panel;
    a panel roller elongated and controllably winding up and unwinding the display panel;
    a bottom frame on which the panel roller is rotatably mounted;
    a first vertical frame elongated in a direction intersecting a longitudinal direction of the panel roller and fixed to the bottom frame;
    a first lead screw located adjacent and parallel to the first vertical frame and rotatably mounted on the bottom frame;
    a first gearbox located adjacent to the first vertical frame and mounted on an upper side of the bottom frame;
    a second gearbox mounted on a lower side of the bottom frame and rotating the first lead screw by receiving power from the first gearbox;
    a first slider moving in an up-downward direction on the first lead screw according to rotation of the first lead screw; and
    a bar to which a distal end of the display panel is fixed, and the bar is coupled to the first slider.

2. The display device of claim 1, further comprising:
    a motor located at a rear of the panel roller and mounted on the bottom frame; and
    a transmission shaft including one end connected to the motor and an other end connected to the first gearbox.

3. The display device of claim 2, wherein the first gearbox comprises:
    a first bevel gear fixed to the other end of the transmission shaft; and
    a second bevel gear engaged with the first bevel gear and transmitting power to the second gearbox.

4. The display device of claim 3, wherein the second gearbox comprises:
    a first gear opposite to the second bevel gear with respect to the bottom frame;
    at least one gear engaged with the first gear; and
    a fourth gear engaged with the at least one gear and rotating together with the first lead screw inserted therein,
    wherein the first gear has a bevel shaft inserted and fixed and the bevel shaft is a rotation shaft of the second bevel gear.

5. The display device of claim 4, wherein a diameter of the fourth gear is smaller than a diameter of the first gear.

6. The display device of claim 5, wherein the at least one gear comprises:
    a second gear engaged with the first gear; and
    a third gear engaged with the second gear and the fourth gear,
    wherein a diameter of the third gear is greater than a diameter of the first gear, and
    a diameter of the second gear is greater than the diameter of the third gear.

7. The display device of claim 3, wherein the second gearbox comprises:
    a first roller opposite to the second bevel gear with respect to the bottom frame;
    a third roller rotating together with the first lead screw; and a belt wound around the first roller and the third roller,
wherein the first roller has a bevel shaft inserted and fixed and the bevel shaft is a rotation shaft of the second bevel gear.

8. The display device of claim 7, wherein the second gearbox further comprises:
a second roller located between the first roller and the third roller, the belt is wound around the second roller;
a first tension roller located between the first roller and the second roller and pushing the belt; and
a second tension roller located between the second roller and the third roller and pushing the belt.

9. The display device of claim 8, wherein the first tension roller pushes the belt between the first roller and the second roller to be close to the belt between the first roller and the third roller, and
the second tension roller pushes the belt between the second roller and the third roller to be close to the belt between the first roller and the third roller.

10. The display device of claim 9, further comprising:
a second vertical frame opposite to the first vertical frame with respect to the panel roller, and the second vertical frame fixed to the bottom frame;
a second lead screw located adjacent and parallel to the second vertical frame and rotatably mounted on the bottom frame;
a third gearbox located adjacent to the second vertical frame and mounted on an upper side of the bottom frame;
a fourth gearbox mounted on a lower side of the bottom frame and rotating the second lead screw by receiving power from the third gearbox;
a second slider moving in an up-downward direction on the second lead screw according to rotation of the second lead screw; and
wherein the bar is coupled to the first slider and the second slider.

11. The display device of claim 10, wherein the transmission shaft is a first transmission shaft,
wherein the display device further comprises a second transmission shaft including one end connected to the motor and the other end connected to the third gearbox,
wherein the second slider moves in an up-downward direction in the second lead screw while the second lead screw rotates by rotational force provided from the motor, the rotational force is transmitted through the second transmission shaft, the third gearbox, and the fourth gearbox.

12. The display device of claim 11, wherein the first slider is in contact with the first vertical frame while moving on the first lead screw, and
wherein the second slider is in contact with the second vertical frame while moving on the second lead screw.

13. The display device of claim 12, further comprising:
a rotator fixed to the first lead screw or the second lead screw; and
a sensor located adjacent to the rotator and detecting rotation of the rotator.

14. The display device of claim 12, further comprising:
a rotator fixed to the first transmission shaft or the second transmission shaft; and
a sensor located adjacent to the rotator and detecting rotation of the rotator.

* * * * *